United States Patent
Delgado et al.

(10) Patent No.: US 10,953,441 B2
(45) Date of Patent: Mar. 23, 2021

(54) SYSTEM AND METHOD FOR CLEANING OPTICAL SURFACES OF AN EXTREME ULTRAVIOLET OPTICAL SYSTEM

(71) Applicant: KLA-Tencor Corporation, Milpitas, CA (US)

(72) Inventors: Gildardo Delgado, Livermore, CA (US); Francis Chilese, San Ramon, CA (US); Rudy F. Garcia, Union City, CA (US); Mohammed Tahmassebpur, San Ramon, CA (US); Salam Harb, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 1192 days.

(21) Appl. No.: 13/857,615

(22) Filed: Apr. 5, 2013

(65) Prior Publication Data
US 2014/0261568 A1    Sep. 18, 2014

Related U.S. Application Data

(60) Provisional application No. 61/792,581, filed on Mar. 15, 2013.

(51) Int. Cl.
*G03F 7/00* (2006.01)
*B08B 5/00* (2006.01)
(Continued)

(52) U.S. Cl.
CPC ............. *B08B 5/02* (2013.01); *G03F 1/84* (2013.01); *G03F 7/70616* (2013.01); *G03F 7/70925* (2013.01); *G03F 7/70933* (2013.01)

(58) Field of Classification Search
CPC ............. G02B 27/0006; G03F 7/70925; G03F 7/70933; G03F 1/82; G03F 1/84; B08B 5/02; B08B 5/00; B08B 7/00
(Continued)

(56) References Cited

U.S. PATENT DOCUMENTS

| 5,419,351 A | 5/1995 | Ciari |
| 6,192,897 B1 | 2/2001 | Klebanoff |

(Continued)

FOREIGN PATENT DOCUMENTS

| DE | 102005032320 A1 | 1/2007 |
| EP | 1726993 A1 | 11/2006 |

(Continued)

OTHER PUBLICATIONS

Author: N. Škoro et al. Title: Cleaning of Organic Contamination from EUV Optics Surfaces Using Hydrogen-based Plasmas Source: http://www.pse-conferences.net/tl_files/pse2012/abstractupload/PSE2012-PO1029-ext.pdf.

(Continued)

*Primary Examiner* — Marc Lorenzi
(74) *Attorney, Agent, or Firm* — Suiter Swantz pc llo

(57) ABSTRACT

The present invention provides a local clean microenvironment near optical surfaces of an extreme ultraviolet (EUV) optical assembly maintained in a vacuum process chamber and configured for EUV lithography, metrology, or inspection. The system includes one or more EUV optical assemblies including at least one optical element with an optical surface, a supply of cleaning gas stored remotely from the one or more optical assemblies and a gas delivery unit comprising: a plenum chamber, one or more gas delivery lines connecting the supply of gas to the plenum chamber, one or more delivery nozzles configured to direct cleaning gas from the plenum chamber to a portion of the EUV assembly, and one or more collection nozzles for removing gas from the EUV optical assembly and the vacuum process chamber.

18 Claims, 17 Drawing Sheets

(51) Int. Cl.
  *B08B 7/00* (2006.01)
  *B08B 5/02* (2006.01)
  *G03F 7/20* (2006.01)
  *G03F 1/84* (2012.01)
(58) Field of Classification Search
  USPC .................................................. 250/492.2
  See application file for complete search history.

(56) References Cited

U.S. PATENT DOCUMENTS

| | | | |
|---|---|---|---|
| 6,374,512 B1 | 4/2002 | Guo et al. | |
| 6,652,726 B1 | 11/2003 | Chou | |
| 6,661,018 B1* | 12/2003 | McGregor | G03F 7/70033 250/492.22 |
| 6,672,725 B1 | 1/2004 | VanOsdol et al. | |
| 6,968,850 B2 | 11/2005 | Chan et al. | |
| 7,061,573 B2 | 6/2006 | Tsukamoto | |
| 7,316,893 B2 | 1/2008 | Panning et al. | |
| 7,372,049 B2 | 5/2008 | Van Herpen et al. | |
| 7,414,700 B2 | 8/2008 | Van Herpen et al. | |
| 7,459,708 B2 | 12/2008 | Inoue et al. | |
| 7,518,128 B2 | 4/2009 | Van Herpen et al. | |
| 7,518,132 B2* | 4/2009 | Kanazawa | B82Y 10/00 250/492.2 |
| 7,750,326 B2 | 7/2010 | Van Herpen et al. | |
| 7,789,965 B2 | 9/2010 | Matsushita et al. | |
| 7,812,330 B2 | 10/2010 | Banine et al. | |
| 7,875,864 B2 | 1/2011 | Sogard | |
| 7,927,428 B2 | 4/2011 | Shibazaki | |
| 8,049,188 B2* | 11/2011 | Metzmacher | G03F 7/70916 134/1 |
| 8,076,655 B2 | 12/2011 | Derra et al. | |
| 8,097,092 B2 | 1/2012 | Derra et al. | |
| 8,147,647 B2 | 4/2012 | Schriever | |
| 2004/0011381 A1 | 1/2004 | Klebanoff et al. | |
| 2004/0165160 A1 | 8/2004 | Van Beek et al. | |
| 2005/0104015 A1 | 5/2005 | Wedowski et al. | |
| 2006/0175558 A1* | 8/2006 | Bakker | G03F 7/70175 250/492.2 |
| 2007/0125964 A1 | 6/2007 | Van Herpen et al. | |
| 2007/0145297 A1* | 6/2007 | Freriks | B82Y 10/00 250/492.2 |
| 2008/0001101 A1 | 1/2008 | Wilhelmus Van Herpen et al. | |
| 2008/0099699 A1* | 5/2008 | Yabuta | G03F 7/70033 250/504 R |
| 2010/0288302 A1 | 11/2010 | Ehm et al. | |
| 2011/0058147 A1 | 3/2011 | Ehm et al. | |
| 2011/0188011 A1 | 8/2011 | Ehm et al. | |
| 2011/0279799 A1 | 11/2011 | Singer et al. | |
| 2012/0006258 A1* | 1/2012 | Schasfoort | G03F 7/70925 118/63 |
| 2012/0182536 A1* | 7/2012 | Loopstra | G03F 7/70033 355/67 |
| 2012/0250144 A1 | 10/2012 | Ehm et al. | |
| 2014/0166051 A1* | 6/2014 | Umstadter | G03F 7/70033 134/21 |

FOREIGN PATENT DOCUMENTS

| | | |
|---|---|---|
| JP | 2009016640 A | 1/2009 |
| WO | 2014126915 A1 | 8/2014 |

OTHER PUBLICATIONS

Author: Iwaonishiyama1 et al. Title: Atomic Hydrogen Cleaning for EUV Optics Contamination Source: http://www.sematech.org/meetings/archives/litho/8059/pres/CC-02-Nishiyama.pdf Publication Details: EUVL Symposium 2007, Sapporo, Oct. 31, 2007.

Author: Toshihisa Anazawa et al. Title: Cleaning of Silicon-Containing Carbon Contamination Source: http://www.sematech.org/meetings/archives/litho/8939/pres/RC-P04.pdf Publication Details: EUVL Symposium 2010.

Author: Juequan Chen Title: Characterization of EUV induced contamination on multilayer optics Source: http://doc.utwente.nl/77597/1/thesis_J_Chen.pdf Publication Details:Thesis, 2011.

Author: R. Wasielewski et al. Title: Surface chemistry of Ru: relevance to optics lifetime in EUVL Source: 23rd European Mask and Lithography Conference, edited by Uwe F. W. Behringer, Proc. of SPIE vol. 6533, 653316, (2007), 12 pages.

Klebanoff, L. E., Malinowski, M. E., Grunow, P., Cliff, W. M., Steinhaus, C., Leung, A. H. and Haney, S. J., "First environmental data from the EUV Engineering Test Stand," Proc. SPIE 4343, 342 (2001).

Kurt, R., van Beek, M., Crombeen, C., Zalm, P. and Tamminga, Y., "Radiation induced carbon contamination of optics," Proc. SPIE 4688, 702 (2002).

Hollenshead, J. and Klebanoff, L., "Modeling radiation-induced carbon contamination of extreme ultraviolet optics," J. Vac. Sci. Technol. B 24, 64 (2006).

Matsunari, S., Aoki, T., Murakami, K., Gomel, Y., Terashima, S., Takase, H., Tanabe, M., Watanabe,Y., Kakutani, Y., Niibe, M. and Fukuda, Y., "Carbon deposition on multi-layer mirrors by extreme ultra violet ray irradiation," Proc. SPIE 6517, 65172X (2007).

Schürmann, M., Yulin, S., Nesterenko, V., Feigl, T., Kaiser, N., Tkachenko, B. and Schürmann, M. X., "Multitechnique study of carbon contamination and cleaning of Mo/Si mirrors exposed to pulsed EUV radiation," Proc. SPIE 7636, 76361P (2010).

J. Assmann, V. Narkhede, L. Khodeir, E. Löffler, O. Hinrichsen, A Birkner, H. Over, and M. Muhler, "On the nature of the active state of supported ruthenium catalysts used for the oxidation of carbon monoxide: steady-state and transient kinetics combined with in situ infrared spectroscopy", J. Phys. Chem. B 108, 14634-14642 (2004).

J. Xie, W. J. Mitchell, K. J. Lyons, Y. Wang, and W. H. Weinberg, "Observation of the reaction of gas-phase atomic hydrogen with Ru(001)-p(1x2)-O at 100K", J. Vac. Sci. Technol. A 12, 2210-2214 (1994).

M. Schick, J. Xie, W. J. Mitchell, and W. H. Weinberg, "Interaction of gas-phase atomic deuterium with the Ru(001)-(1x2)-O surface: Kinetics of hydroxyl and water formation", J. Chem. Phys. 104, 7713-7718 (1996).

H. Oizumi, H. Yamanashi, I. Nishiyama, K. Hashimoto, S. Ohsono, A. Masuda, A. Izumi, and H. Matsumura, "Contamination removal from EUV multilayer using atomic hydrogen generated by heated catalyzer", Proc. SPIE 5751, 1147-1154 (2005).

Nishiyama, H. Oizumi, , K. Motai, A. Izumi, T. Ueno, H. Akiyama, and A. Namiki, "Reduction of oxide layer on Ru surface by atomic-hydrogen treatment", J. Vac. Sci. Technol. B 23, 3129-3131 (2005).

Examination Report dated Mar. 25, 2020 for EP Application No. 14769672.8.

* cited by examiner

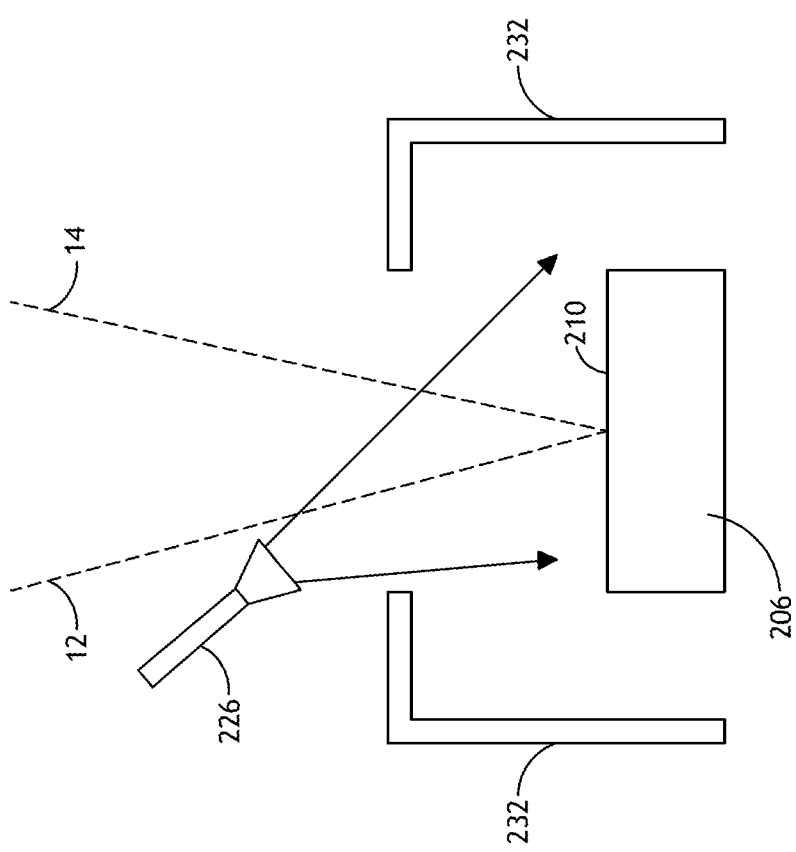

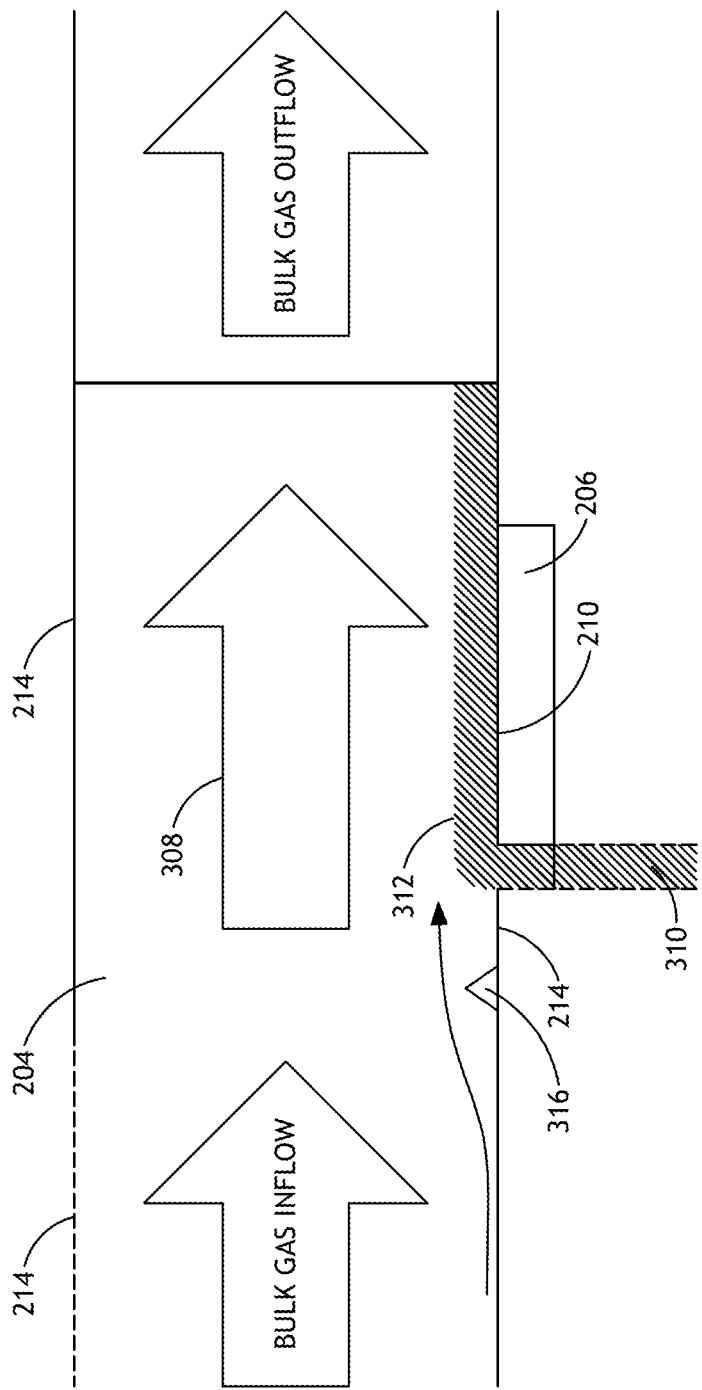

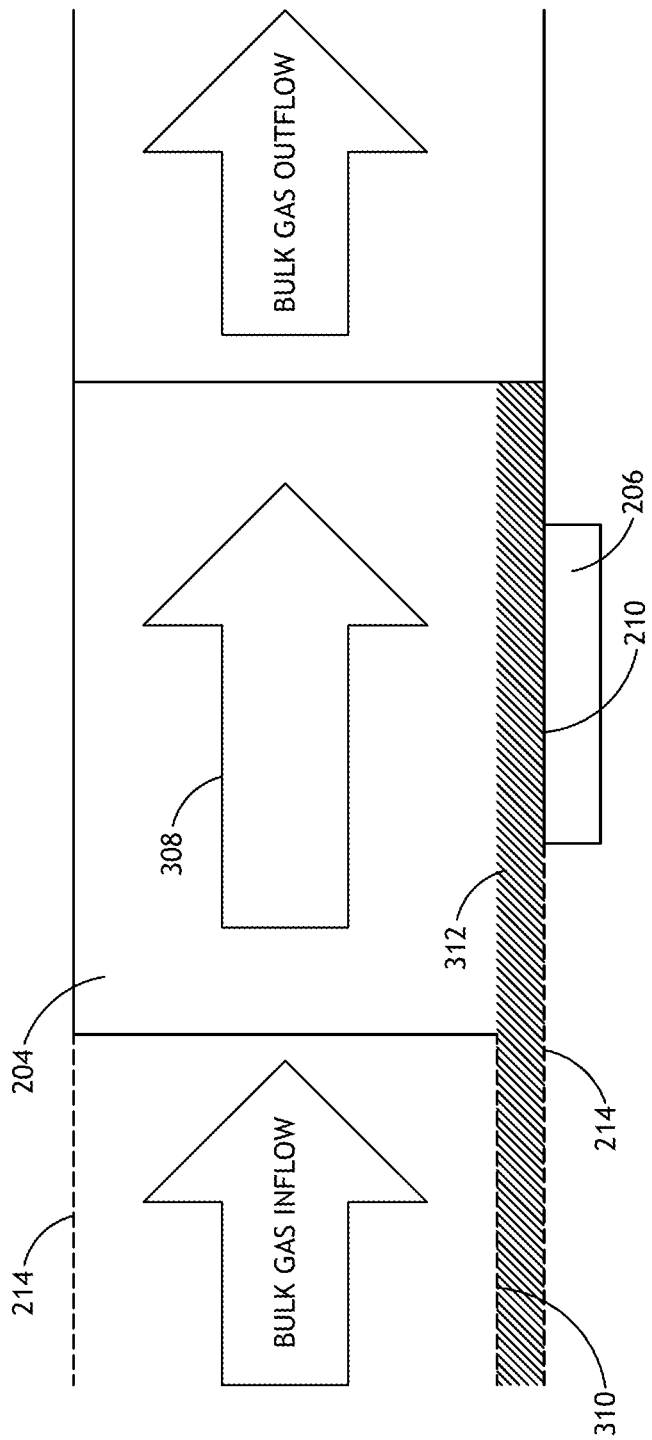

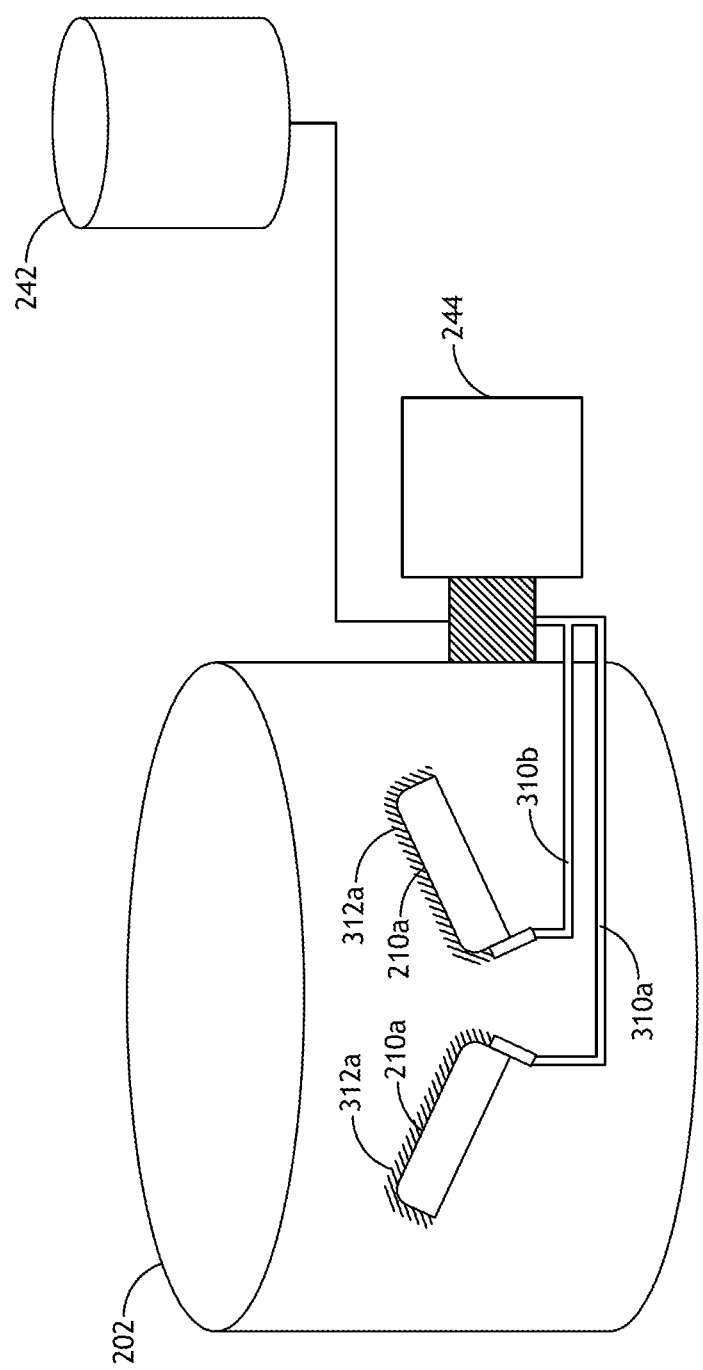

SYSTEM AND METHOD FOR CLEANING OPTICAL SURFACES OF AN EXTREME ULTRAVIOLET OPTICAL SYSTEM

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled SYSTEM AND METHOD FOR CLEANING OPTICAL SURFACES, naming Gildardo Delgado, Francis Chilese, Rudy F. Garcia, Mohamed Tahmassebpur and Salam Harb as inventors, filed Mar. 15, 2013, Application Ser. No. 61/792,581.

TECHNICAL FIELD

The present invention relates to the cleaning of optical surfaces maintained in a vacuum process chamber. In particular, the present invention relates to a method and system for cleaning optical surfaces in an extreme ultraviolet light based lithography, inspection or metrology system.

BACKGROUND

In order to keep pace with the ever increasing demand for smaller and smaller integrated circuit devices improved precision is needed in device fabrication and diagnostic tools. Extreme ultraviolet (EUV) lithography, EUV metrology and EUV inspection represent the next generation in integrated circuit processing and analysis technology, using 13.5 nm ultraviolet light. EUV light is highly absorbable by most media. For example, EUV light may be readily absorbed by a plasma light source used to generate the EUV light, an image mask, intervening air molecules and generally any other medium the EUV photons may encounter.

In order to mitigate the impact of EUV photon absorption, EUV lithography, metrology and inspection processes take place in a vacuum process chamber. Generally, an EUV optical system includes one or more highly reflective multilayer coated mirrors (e.g., molybdenum/silicon (Mo/Si) coated mirrors), which function as Bragg diffractors, reflecting EUV light at $\lambda=13.5$ nm via interlayer interference. In addition, these mirrored optical surfaces are occasionally coated with a protective layer, such as a protective layer of ruthenium (Ru) or some other type of protective cap layer, that is both highly reflective and resistant to oxidation. EUV photons or secondary electrons resulting from the emission process can contribute to contamination of optical surfaces in the vacuum process chamber through oxidation or carbonaceous growth on the mirrored optical surface. In addition, scattered radiation from the plasma source can induce outgassing from the vacuum chamber's internal surfaces and components. EUV mask inspection systems include various optics, sensors, adhesives, electric wiring, motors, and numerous other components. Although carefully screened for materials choices and cleaned to be compatible with ultra-clean vacuum (UCV), all these components will outgas. The residual contaminants, as a result of outgassing products, consist of many different contaminating compounds. In addition, residual gases may include hydrogen, oxygen, argon and xenon. Therefore, the UCV environment in a typical EUV mask inspection system will include background gas constituents containing these residual contaminants and gasses. For example, the resulting contaminants may include water molecules, light and heavy hydrocarbons, metal hydrides, inorganics, acids, bases, siloxanes, nitrides and other chemical compounds and species that can also interact with and contaminate optical surfaces.

To ensure maximum EUV inspection system optical throughput and uptime one must minimize the light intensity loss due to gas absorption and optical surface contamination. A UCV operating environment is preferred in EUV inspection systems. Specifically, UCV systems need to be ultrahigh purity with very low contaminants concentrations. UCV environments generally have lower impurity levels, thus require a much higher level of cleaning relative to ultrahigh vacuum (UHV) environments. For example, the partial pressures of contaminants such as hydrocarbons need to be at approximately $\sim 10^{-12}$ mbar, with water partial pressure below $\sim 10^{-7}$ mbar. In addition, the system can operate at relative high pressure compared to UHV. For example, the inspection system can operate at total pressures in the range of 0.1-10 Pa rather than low vacuum levels typical of ultrahigh vacuum (UHV) systems.

Either form of surface contamination, whether by oxidation, carbonaceous growth, or by other chemical species leads to increased absorption (and decreased reflection) of EUV photons, which in turn affects the uniformity of reflectivity throughout the given EUV optical system. For example, a typical EUV inspection, metrology or lithography tool typically requires reflecting EUV photons through a series of such mirrors, and even these highly reflective optical surfaces will reflect only 70% of EUV photons under optimal conditions. Therefore, even a minimal level of optical surface contamination, and the corresponding loss of reflectivity, can drastically impact the overall throughput of the EUV optical assembly. Maintaining optimal reflectivity throughout the system, and thus optimal throughput, requires the reduction and prevention of both oxidation, carbonaceous or other types of contamination growth on optical surfaces.

FIGS. 1A and 1B depict an optical assembly 100 with a small (~25 mm diameter) multilayered Mo/Si mirror 16 or a large (~250 mm diameter) multilayered Mo/Si mirror 22. Each mirror has a highly reflective optical surface 18 which may include an additional ruthenium capping layer. Incident EUV photons 12 strike the optical surface 18 and a majority of these EUV photons are reflected (14) by the optical surface 18. Absorbed EUV photons and secondary radiation contribute to the formation of contaminants 20 on the optical surface 18. It is, therefore, desirable to provide a method and system that cures the defects identified in the above prior art.

SUMMARY

A system for providing a local clean microenvironment near optical surfaces of an extreme ultraviolet optical assembly maintained in a vacuum process chamber is disclosed. In one aspect, the system includes, but is not limited to, one or more extreme ultraviolet optical assemblies including at least one optical element with an optical surface, wherein the one or more extreme ultraviolet optical assemblies comprise at least a portion of at least one of an extreme ultraviolet inspection tool, an extreme ultraviolet metrology tool and an extreme ultraviolet lithography tool; a supply of cleaning gas stored remotely from the one or more optical assemblies; and a gas delivery unit comprising: at least one plenum chamber; one or more gas delivery lines connecting the supply of gas to the at least one plenum chamber; at least one delivery nozzle configured to direct cleaning gas from the plenum chamber to the one or more portions of the one or more extreme ultraviolet optical assemblies; and at least one collection nozzle for removing gas from the one or more extreme ultraviolet optical assemblies and the vacuum process chamber.

In another aspect, a system may include, but is not limited to, at least one extreme ultraviolet optical assembly, including one or more optical elements, the one or more optical elements including one or more optical surfaces, wherein the one or more extreme ultraviolet optical assemblies comprise at least a portion of at least one of an extreme ultraviolet inspection tool, an extreme ultraviolet metrology tool and an extreme ultraviolet lithography tool; a process gas delivery unit including a supply of process gas stored remotely from the vacuum process chamber and at least one distribution line connected to the process gas supply for directing the gas through the vacuum process chamber; a supply of purified cleaning gas stored remotely from the vacuum process chamber; at least one bleed flow system including one or more delivery nozzles and one or more gas distribution lines connecting the one or more delivery nozzles to the supply of cleaning gas, the one or more delivery nozzles configured to form a bleed flow of the purified cleaning gas at an interface of the one or more optical surfaces of the extreme ultraviolet optical assembly, wherein the bleed flow of the purified cleaning gas forms a boundary layer between the process gas directed through the vacuum chamber and the one or more optical surfaces, the boundary layer configured to protect the one or more optical surfaces from one or more contaminants carried in the process gas; and at least one extraction pump for removing gas from the vacuum process chamber.

A method for cleaning optical surfaces of an extreme ultraviolet optical assembly maintained in a vacuum process chamber is disclosed. In one aspect, the method includes, but is not limited to, directing at least one gas suitable for cleaning uniformly over an optical surface of an extreme ultraviolet based optical assembly, the at least one gas configured to displace one or more species causing oxidation on the optical surface; collecting at least one gas and one or more contaminants carried by the gas; and removing the gas from the vacuum process chamber.

In another aspect, a method may include, but is not limited to, directing at least one process gas through a vacuum process chamber in bulk; directing a high purity cleaning gas between the flow of the process gas and an optical surface of an extreme ultraviolet optical system; collecting the process gas, contaminants carried in the process gas, the cleaning gas and contaminants carried in the cleaning gas; and removing the process gas and cleaning gas from the vacuum process chamber.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The advantages of the present invention may be better understood by those skilled in the art by reference to the accompanying figures in which:

FIG. 3F is a schematic side view of a small optical surface cleaned by a single gas delivery unit using a collection shroud in accordance with an alternative embodiment of the present invention.

FIG. 3G is a schematic side view of a small optical surface cleaned by a perpendicular-mount bleed flow system in accordance with an alternative embodiment of the present invention.

FIG. 3H is a schematic side view of a small optical surface cleaned by a parallel-mount bleed flow system in accordance with an alternative embodiment of the present invention.

FIG. 3J is a schematic view of a vacuum process chamber wherein multiple optical surfaces are cleaned by a bleed flow system in accordance with an alternative embodiment of the present invention.

DETAILED DESCRIPTION

Figure 1A:
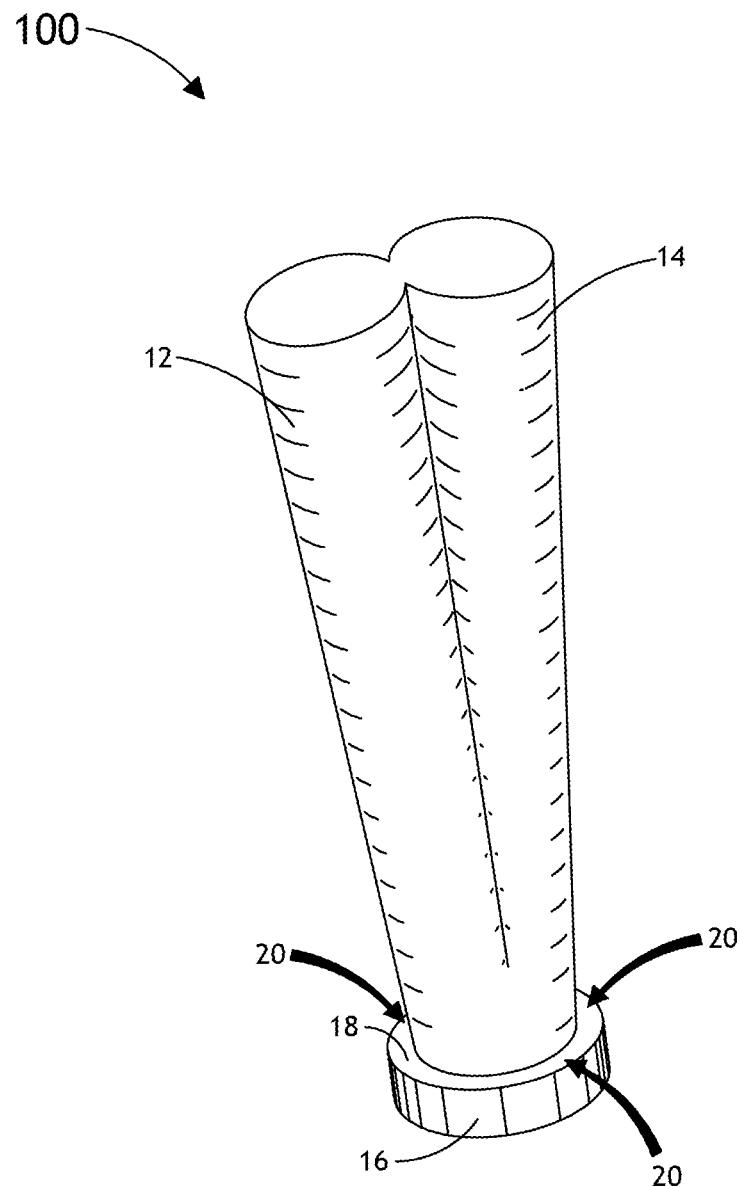
FIG. 1A is a prior art illustration of an optical element with a small optical surface.
Figure 1B:
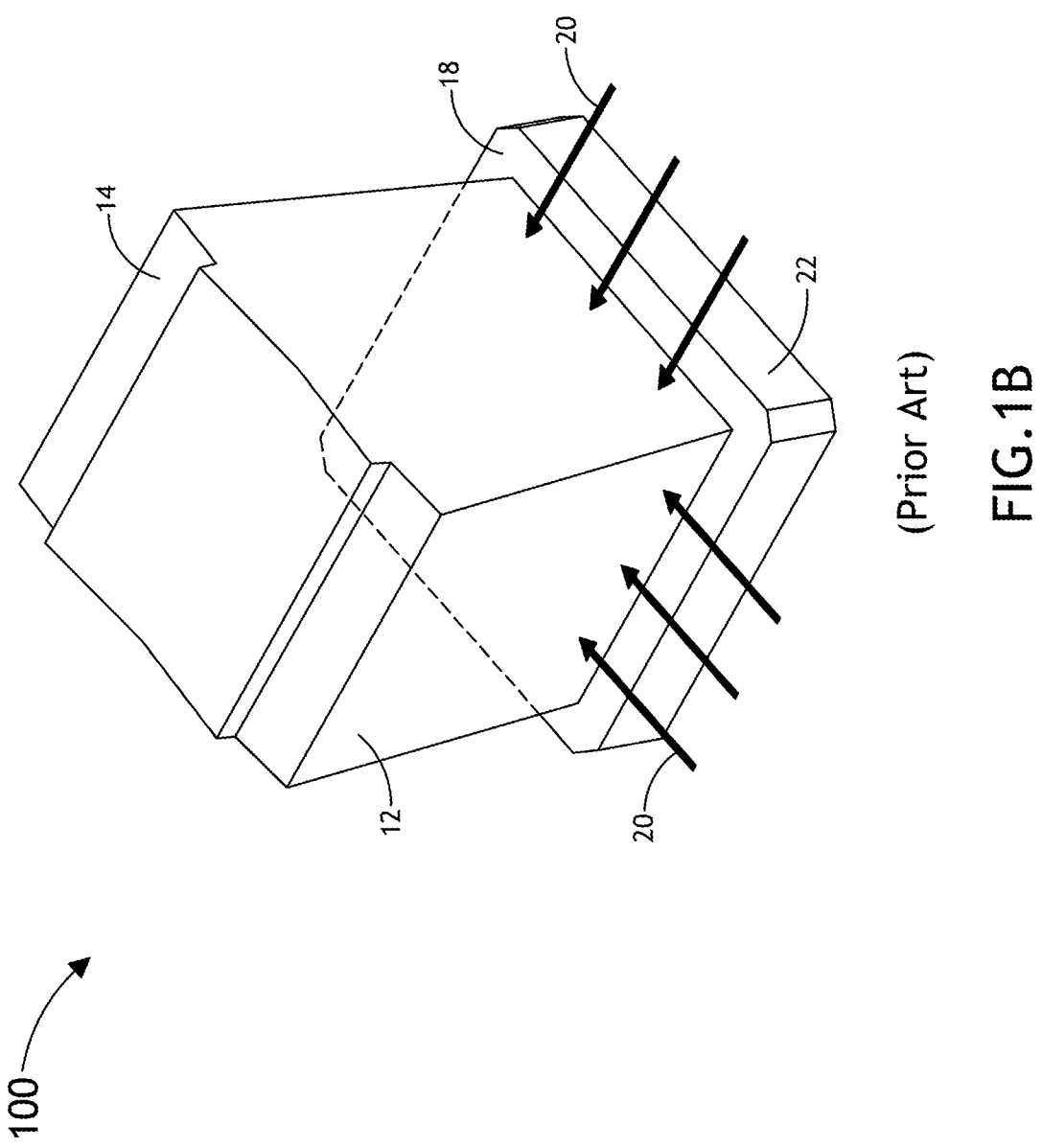
FIG. 1B is a prior art illustration of an optical element with a large optical surface.

Features of the present invention in its various embodiments are exemplified by the following descriptions with reference to the accompanying drawings, which describe the present invention with further detail. These drawings depict only selected embodiments of the present invention, and should not be considered to limit its scope in any way.

The prevention of surface oxidation of a given optical surface includes the minimization, or at least reduction, of the partial pressure of water or oxygen in the vicinity of the optical surface. For example, this may be accomplished by directing a dry, non-oxygenated gas across the optical surface, which displaces chemical species that might otherwise oxidize on the optical surface. Similarly, preventing carbonaceous growth involves minimizing or at least reducing the partial pressure of hydrocarbons or hydrocarbon-containing gases, which include metal hydrides, siloxanes, acids, bases or other types of contaminates in the vicinity of the optical surface. This is accomplished by directing a non-hydrocarbon-containing gas across the optical surface. A secondary objective is to prevent stray carbon atoms from binding with the optical surface. This is accomplished by occupying sites on the optical surface to which carbon would otherwise bind.

Several gases are well suited to achieve the necessary objectives for preserving reflectivity through cleaning optical surfaces of interest, including inert gases, such as helium, xenon or argon. In addition, molecular hydrogen ($H_2$) is a suitable gas for preventing both oxidation and carbonaceous growth. Molecular hydrogen has the additional advantage of absorbing fewer EUV photons than other gases. Further, atomic hydrogen, when combined with EUV light, has the distinct advantage of being able to react with an O/Ru monolayer often present on an EUV optical surface. In this regard, atomic hydrogen may act to remove oxygen, while leaving pure ruthenium as capping layer for a given multilayer-coated EUV mirror. In addition, the atomic hydrogen may leave water molecules in or on the capping layer, wherein the water molecules may be readily swept away. Further, atomic hydrogen reacts directly with adsorbed oxygen on the optical surface to form hydroxide ions (OH—), which in turn react with other hydrogen atoms to produce $H_2O$ molecules that desorb at 300K.

Generally, methods for cleaning optical surfaces in a vacuum process chamber through the application of molecular or atomic hydrogen deliver the hydrogen in bulk through an entire optical assembly to prevent or reduce oxidation on optical surfaces. In these settings, such a large volumetric flow of molecular hydrogen may carry with it contaminants from other components and surfaces in its flow path (e.g., motors, cables, structural walls) before contacting the optical surface(s) of interest. In addition, the bulk gas must also flow at low pressure in order to minimize light transmission loss. This high-volume low-pressure flow requires costly pumping systems both to deliver the gas into, and to extract the gas from, the vacuum process chamber. Further, in settings where hydrogen is the utilized process gas, large volumes may be expensive and pose a potential safety hazard.

Similar challenges result from the use of atomic hydrogen, which requires a large number of atomic hydrogen generators in close proximity to the optical assembly. For example, these generators consume power, resulting in excess heat in nearby regions of the optical assembly that may lead to optical distortion. Further, the resulting heat must be carried away by active liquid cooling systems that add complexity to the system as a whole, while producing or carrying vibrations that may contribute to optical distortion. In addition, maintenance of (or access to) cleaning sources generally involves a complex and expensive process, which includes venting the vacuum process chamber, partially dismantling the optical assembly, or both.

The present invention relates to a system for cleaning optical surfaces suitable for use in an extreme ultraviolet (EUV) optical system disposed at least partially in a vacuum process chamber. In one embodiment, the optical surfaces may be configured for EUV lithographic projection exposure. In another embodiment, the optical surfaces may be configured for EUV metrology. In still another embodiment, the optical surfaces may be configured for inspection of EUV masks or reticles. In one aspect, the gas selected for cleaning is stored or generated remotely rather than being directly mounted to the optical assembly. This allows easier upgrade or maintenance of the system; for example, an atomic hydrogen generator can be changed without touching the optical assembly. Remote generation and storage of the selected gas protects the optical assembly from the additional heat and vibration associated with gas generation and eliminates the need for additional precautions, such as complex active liquid cooling systems, that may themselves adversely affect the EUV lithography system by contributing to optical distortion.

In a further aspect, restriction of the gas flow to the immediate vicinity of the optical surface through specially configured delivery nozzles and guide skirts greatly reduce the required volumetric flow of gas and consequently the equipment required to generate the gas; a single atomic hydrogen generator can potentially serve multiple optical elements. Restricting the gas flow has the additional advantage of simplifying the process of collecting gas from the optical assembly and removing it from the vacuum process chamber. The likelihood of gas contamination via contact with other surfaces and components of the optical assembly is also greatly reduced.

Figure 2A:
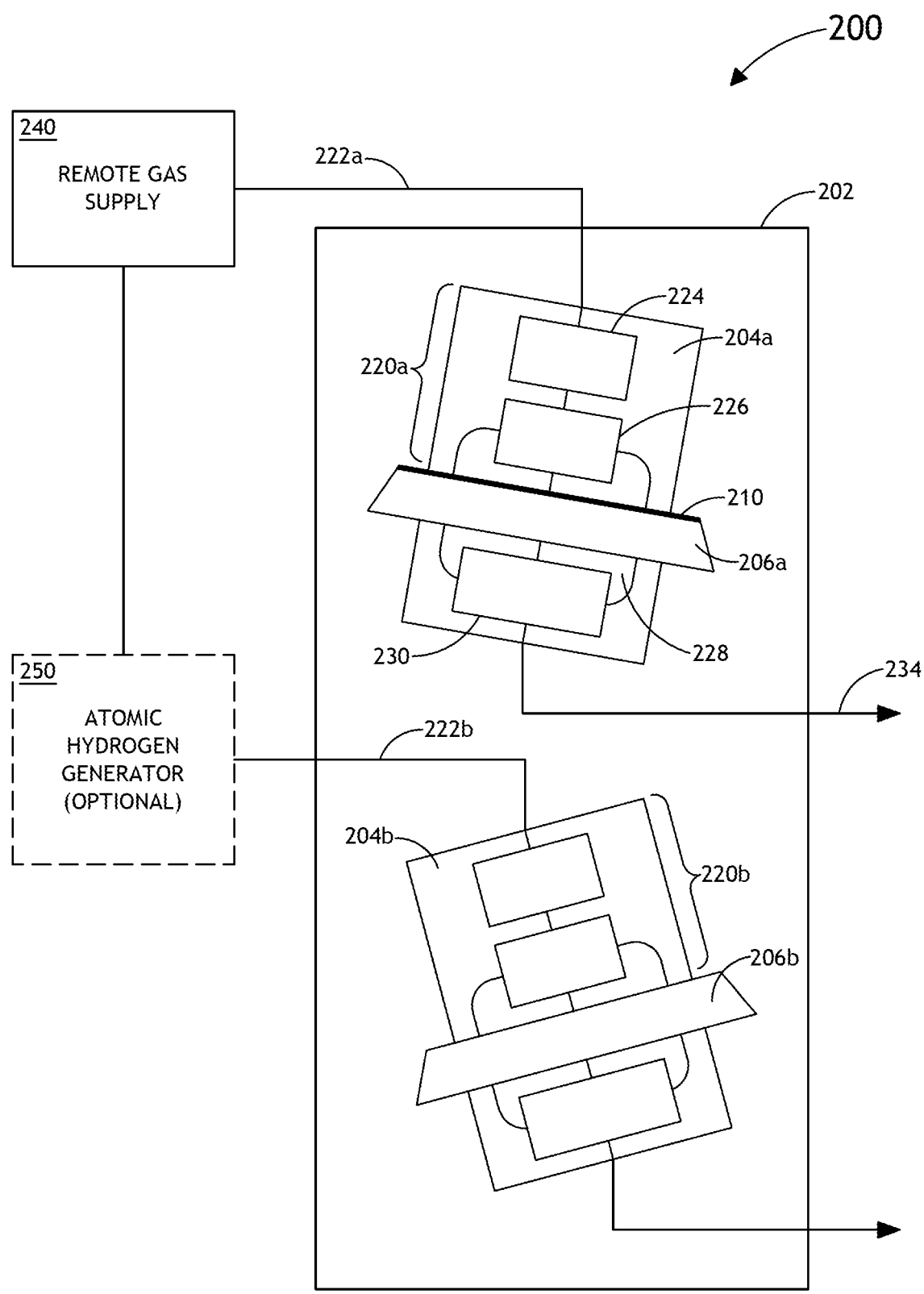
FIG. 2A is a block diagram illustration of a preferred embodiment of the present invention.

FIG. 2A illustrates a block level diagram of a system 200 for cleaning one or more optical surfaces of an EUV optical assembly, in accordance with the present invention. In one aspect, the system 200 includes a vacuum process chamber 202 configured to house one or more optical assemblies 204*a*, 204*b*, . . . each equipped with one or more optical elements 206. The one or more optical elements 206 may include, but are not limited to, a mirror, a filter, a detector (e.g., CCD detector) and the like. In one embodiment of the present invention, an optical element 206 may include a multilayer-coated mirror (e.g., Mo/Si) with highly reflective optical surface 210.

In one embodiment, the vacuum process chamber 202 houses a projection exposure device for EUV lithography. In another embodiment, the vacuum process chamber 202 may house at least a portion of an EUV metrology tool. In still another embodiment, the vacuum process chamber may house at least a portion of an EUV inspection tool (e.g., mask/reticle inspection tool). In another aspect, the system 200 includes one or more gas delivery units 220*a*, 220*b*, . . . operably coupled to each optical assembly of the system 200. In this regard, for each optical assembly 204*a*, 204*b*, . . . a gas delivery unit 220*a*, 220*b*, . . . is configured to supply cleaning gas to an optical surface 210 of the given optical assembly. In one embodiment, a gas delivery line 222*a*, 222*b*, . . . supplies cleaning gas to each gas delivery unit 220*a*, 222*b*, . . . via connection to a plenum chamber 224 by one or more ducts or pipes. The cleaning gas may include any suitable gas that is generally "clean" and/or "dry." For the purposes of the present disclosure the term "clean" is defined as the level of cleanliness required by the cleaning gas in order to achieve the contaminant tolerance of the given optical assembly being implemented. Likewise, the term "dry" is defined as the level of humidity (or rather lack thereof) required to achieve the humidity tolerance of the given optical assembly being implemented. It will be recognized by those skilled in the art that a number of gases are considered "dry" and "clean" for the purposes of the present invention. These gases may include, but are not limited to, molecular hydrogen, atomic hydrogen, molecular helium, atomic helium and the like.

In another embodiment, a supply of cleaning gas 240 is stored under pressure. In another embodiment, the gas supply 240 includes molecular hydrogen or molecular helium. In this regard, the gas supply 240 is not incorporated into the vacuum process chamber 202, but indirectly attached to the gas delivery unit 220 via gas delivery line 222a, 222b, . . . . In another embodiment, multiple optical assemblies 204 in a single vacuum process chamber 202 may be served by a single remote gas supply 240.

By way of example, in the case where the selected cleaning gas includes atomic hydrogen, a remote supply of molecular hydrogen 240 may be connected to one or more atomic hydrogen generators 250. The atomic hydrogen generator 250 may convert the supply of molecular hydrogen into atomic hydrogen, and then supply the resulting atomic hydrogen to the gas delivery unit 220 via the gas delivery line 222a, 222b, In another embodiment, cleaning gas directed to the plenum chamber 224 travels through one or more delivery nozzles 226, which shape and control the flow of gas for dispersal across the optical surface(s) 210. In another aspect, a guide skirt 228 may be configured for one or more of the optical assembly 204a, 204b, . . . to restrict the flow of cleaning gas to the immediate vicinity of the optical surface 210. In another embodiment, a collection nozzle 230 mounted across the optical surface 210 from the delivery nozzle 226 collects cleaning gas from the optical assembly 204 and removes the gas from the vacuum process chamber 202 via an exhaust duct 234. It is noted herein that the selected cleaning glass in generally may include any suitable gas, including, but not limited to, molecular hydrogen, atomic hydrogen, molecular helium and atomic helium. In one embodiment, the cleaning gas is supplied by at least one remote atomic hydrogen generator connected to a remote supply of molecular hydrogen. The remote atomic hydrogen generator may be configured to dissociate remotely supplied molecular hydrogen gas in radiofrequency (RF) discharge. The remote atomic hydrogen generator may be configured to dissociate remotely supplied molecular hydrogen gas in direct current (DC) or low frequency alternating current (AC) discharge. The remote atomic hydrogen generator may flow remotely supplied molecular hydrogen gas across a heated tungsten filament. The remote atomic hydrogen generator may include a plasma source.

Figure 2B:
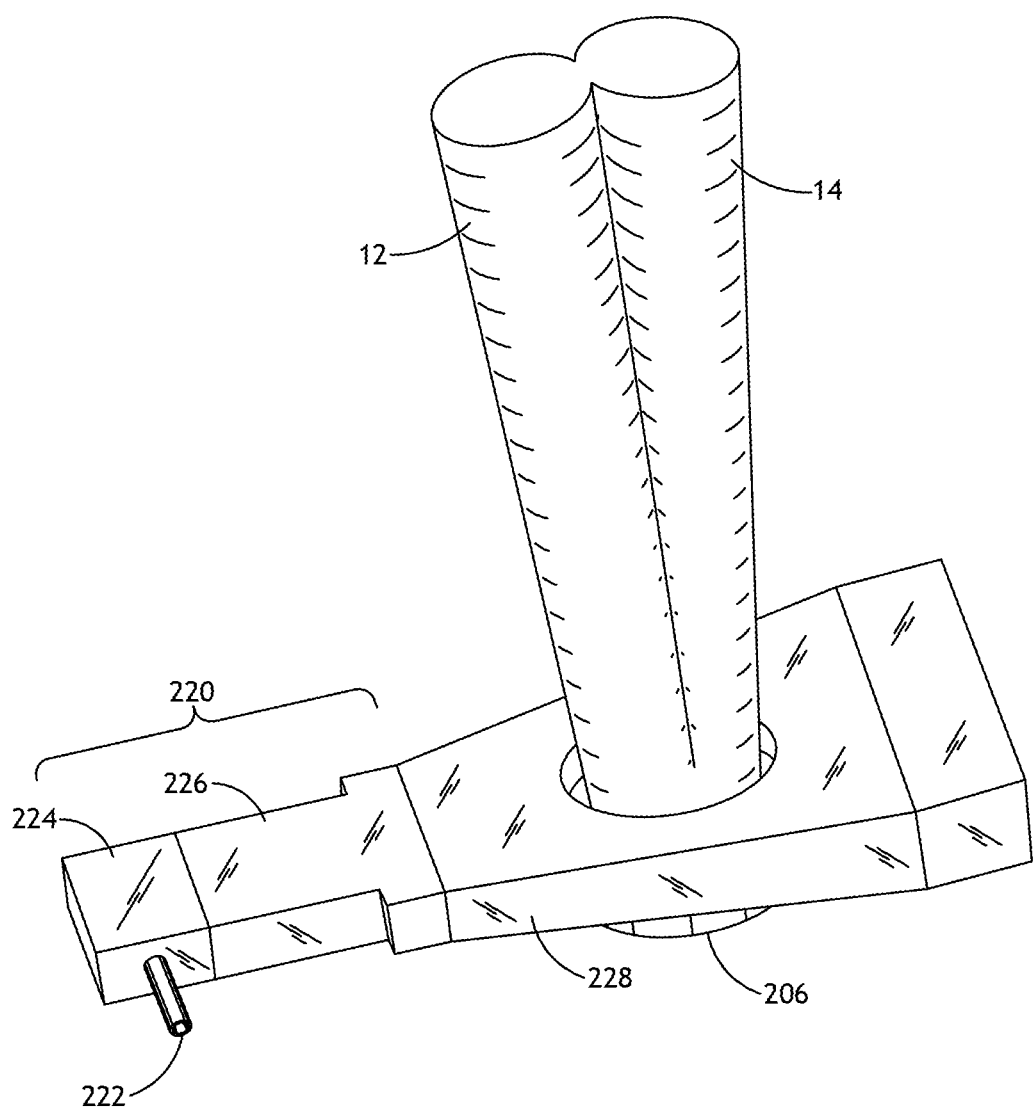
FIG. 2B is an illustration of a small optical surface cleaned by a gas delivery unit in accordance with an embodiment of the present invention.

FIG. 2B depicts a gas delivery unit 220 associated with an optical element 206 of an optical assembly 204, in accordance with an embodiment of the present invention. In one aspect, incident EUV photons 12 strike the surface of optical element 206, and a majority of these EUV photons are reflected (14) by the optical surface. In one embodiment, each gas delivery unit 220 includes a gas delivery line 222, which connects (i.e., fluidically couples) each optical assembly 204 to the remote gas supply (not shown in FIG. 2B). In another embodiment, each gas delivery unit 220 includes a plenum chamber 224 configured to direct gas to the optical assembly 204 at positive pressure. In another embodiment, each gas delivery unit 220 includes a delivery nozzle 226 configured to control the local microenvironment. For example, the delivery nozzle(s) may be used to control (e.g., lower) the partial pressure of low and heavy weight hydrocarbons, acids, bases, metal hydrides, water, oxygen and other contaminates by directing the cleaning gas (i.e., a clean and dry gas) from the plenum chamber to the one or more portions (e.g., a surface of an optical element) of the EUV optical assembly.

In another embodiment, each gas delivery unit 220 includes a delivery nozzle 226 configured to shape the flow of gas through the nozzle along the horizontal and vertical axes before directing the flow of gas from the plenum chamber 224 along the surface of optical element 206, removing contaminants thereon. In another embodiment, a guide skirt 228 may restrict the flow of gas to the immediate vicinity of the optical surface.

In one embodiment of the present invention, a gas delivery line 222 may include ducts or pipes configured to chemically filter the selected gas. For example, in the case where the selected gas includes molecular hydrogen, a gas delivery line 222 may include hydrogen separation membranes, chemical filters, or desiccant filters to maintain the cleanliness and dryness of the molecular hydrogen. By way of another example, in the case where the selected gas includes atomic hydrogen, a gas delivery line 222 may include one or more ducts or pipes including materials to minimize or at least reduce reactivity with atomic hydrogen, such as fused quartz.

Figure 2C:
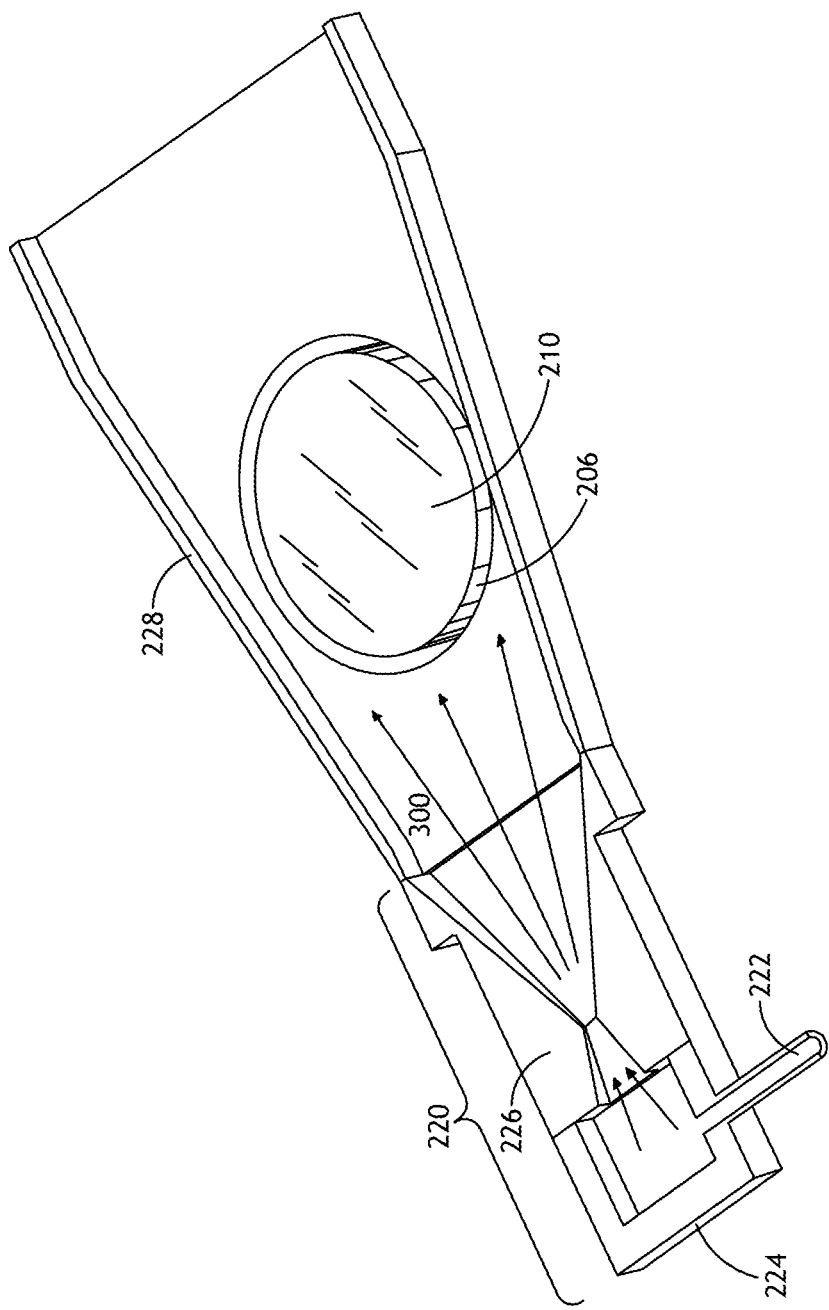
FIG. 2C is an illustration of a horizontal cross section of a small optical surface cleaned by a gas delivery unit in accordance with an embodiment of the present invention.
Figure 3A:
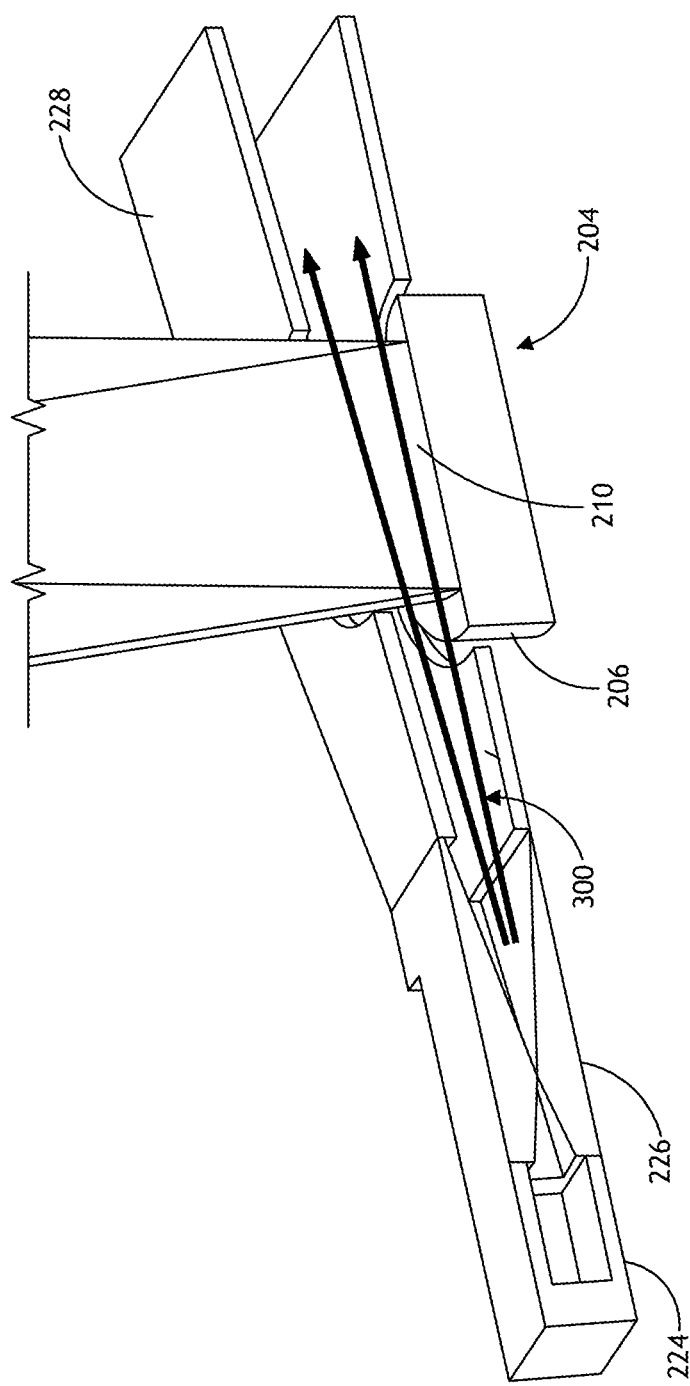
FIG. 3A is an illustration of a vertical cross section of a small optical surface cleaned by a gas delivery unit in accordance with an embodiment of the present invention.

FIGS. 2C and 3A depict cross-sectional views of a gas delivery unit 220 and a corresponding guide skirt 228 associated with an optical element 206 of an optical assembly 204 of system 200, in accordance with one embodiment of the present invention. In one embodiment, the gas delivery unit 220 of the system 200 includes a delivery nozzle 226 suitable for causing the flow of cleaning gas 300 from the plenum chamber 224 to converge and then diverge, thereby directing the flow of gas uniformly along the optical surface 210 of optical element 206. For example, the delivery nozzle 226 may include a double expansion nozzle. In another embodiment, a guide skirt 228 may direct the flow of gas along the optical surface 210 of an optical element 206, restricting the flow of gas to the immediate vicinity of the optical surface 210. In embodiments of the present invention where the selected gas includes either atomic or molecular hydrogen, a directed flow of gas restricted to the optical surface 210 and its immediate vicinity may reduce the volumetric flow of hydrogen required to clean the optical surface 210 of optical element 206. In addition, restricting the flow of gas to the optical surface 210 and its immediate vicinity may prevent or reduce possible contamination of the hydrogen from other components and surfaces of the optical assembly 204 or the vacuum process chamber 200.

Figure 3B:
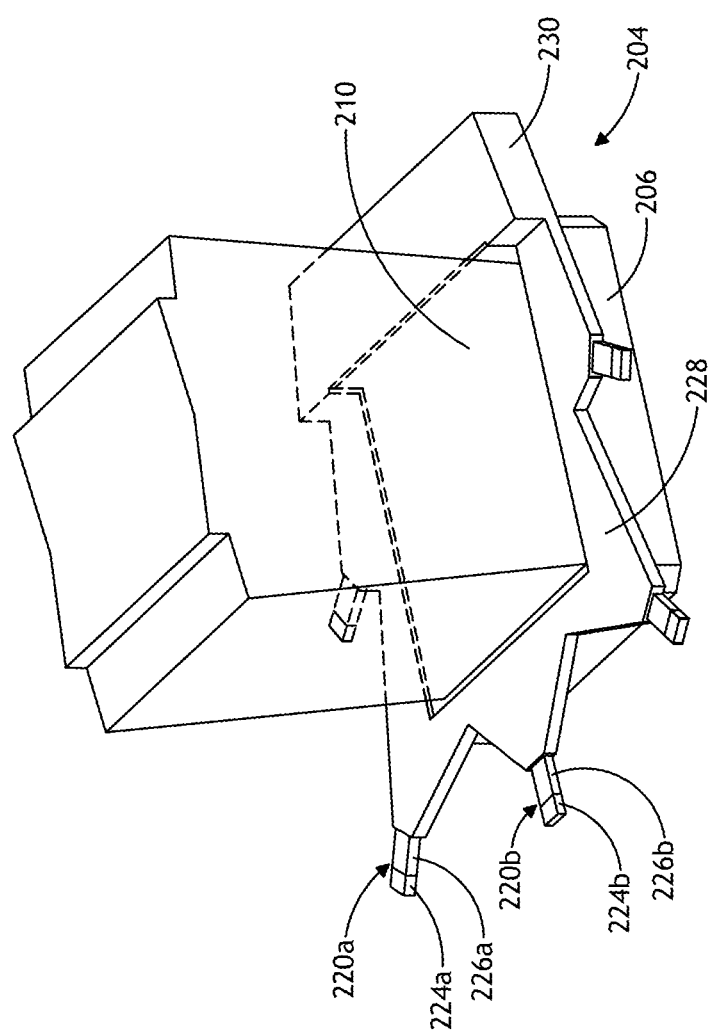
FIG. 3B is an illustration of a large optical surface which is cleaned by a single gas delivery unit using multiple delivery nozzles in accordance with an embodiment of the present invention.
Figure 3C:
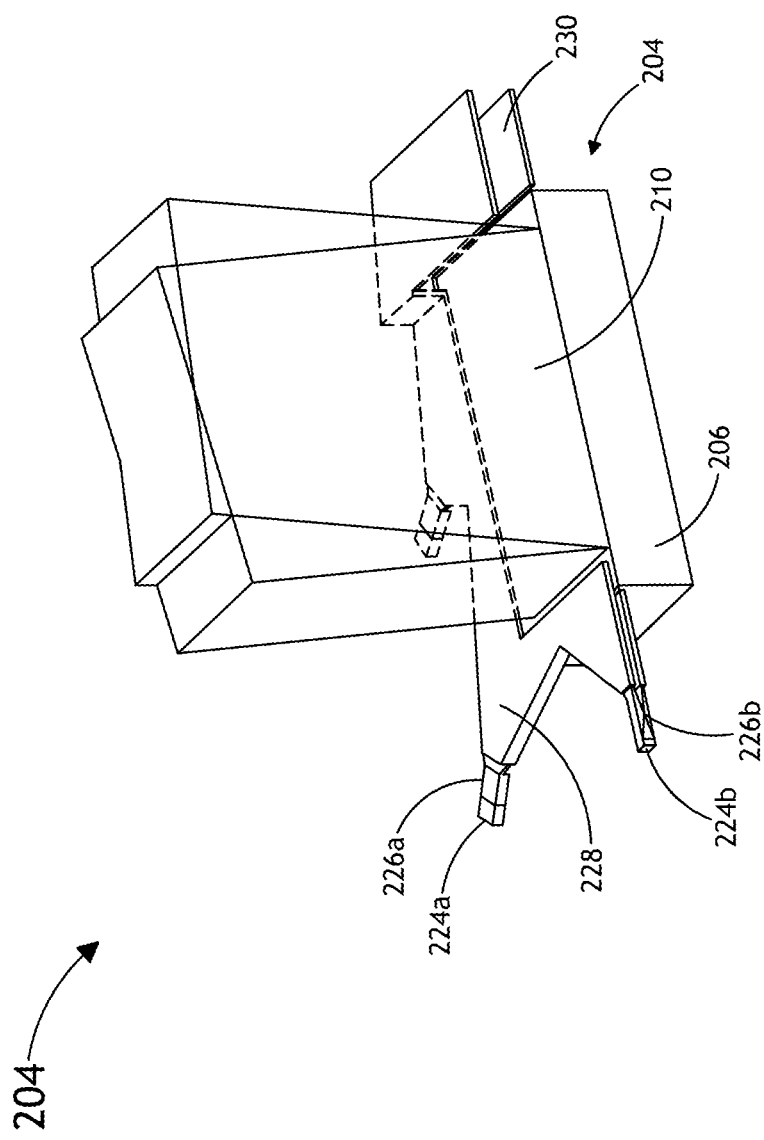
FIG. 3C is an illustration of a vertical cross section of a large optical surface which is cleaned by a single gas delivery unit using multiple delivery nozzles in accordance with an embodiment of the present invention.
Figure 3D:
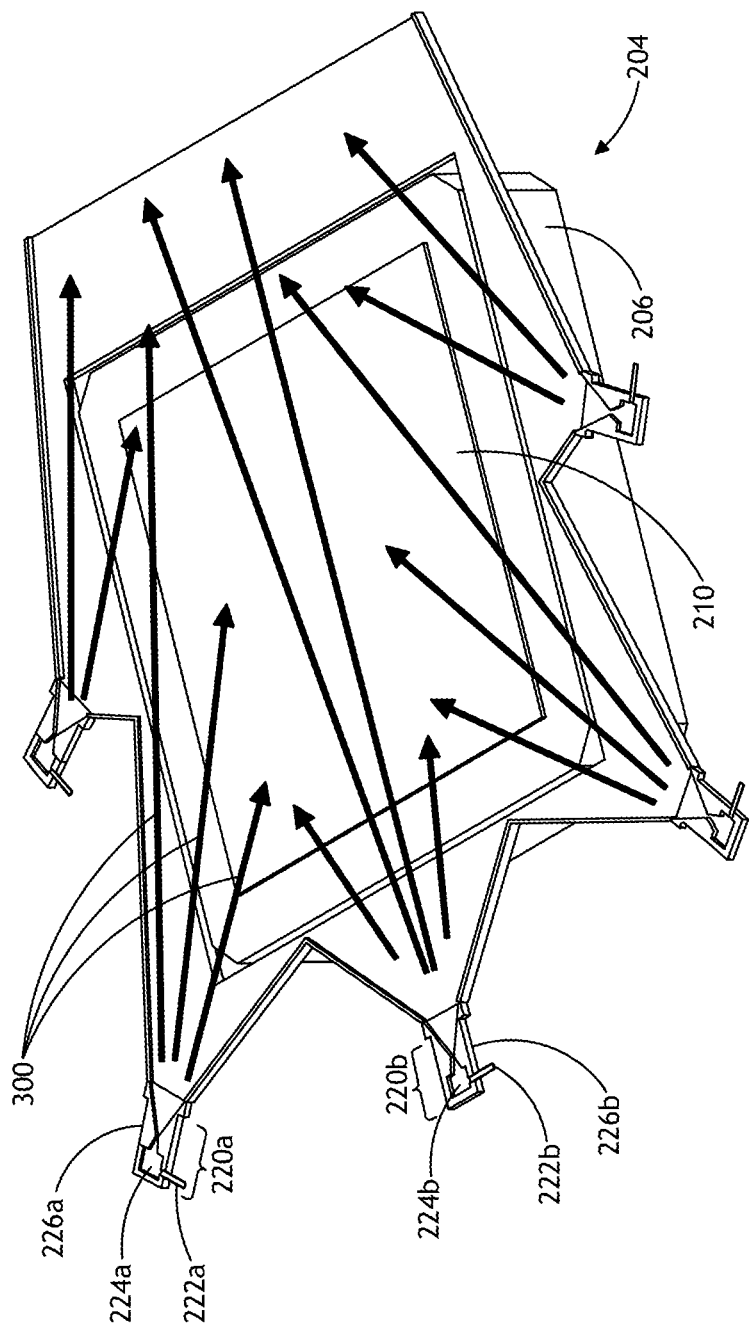
FIG. 3D is an illustration of a horizontal cross section of a large optical surface which is cleaned by a single gas delivery unit using multiple delivery nozzles in accordance with an embodiment of the present invention.

FIGS. 3B-3D depict schematic views of an optical element 206 of an optical assembly 204 coupled to the remote gas supply via multiple gas delivery lines. In this regard, a remote supply of the selected gas may be coupled to a single optical assembly 204 using multiple gas delivery lines 222a, 222b, . . . , as shown in FIG. 3D. In one embodiment, one or more optical elements 206 may include a large (e.g., 250 mm diameter) multilayered mirror (e.g., Mo/Si) with an optical surface 210. In another embodiment, multiple plenum chambers 224a, 224b, . . . may connect the remote gas supply (not shown in FIGS. 3B-3D) to the optical assembly 204. In a further embodiment, multiple delivery nozzles 226a, 226b, . . . may direct the flow of gas across the optical surface 210 of optical element 206. In another aspect, a guide skirt 228 configured to receive gas from the multiple delivery lines may direct the flow of gas along the optical surface 210 and its immediate vicinity toward the collection nozzle 230.

In another embodiment, the system 200 may include multiple gas delivery units. In one embodiment, the multiple gas delivery units 220a, 220b, . . . connect the remote gas supply to the optical assembly 204. In another embodiment, delivery nozzles 226a, 226b, . . . may control and shape the flow of gas 300 from plenum chambers 224a, 224b, . . . to converge and then diverge in, directing the gas flow at a low angle of incidence across the optical surface 210 of optical element 206. In a further aspect, a guide skirt 228 may restrict the flow of gas 300 to the optical surface 210 and its immediate vicinity. It is noted herein that for purposes of clarity only two sets of gas delivery unit/delivery nozzle assemblies are labeled in FIGS. 3B-3D even though five separate assemblies are depicted. In addition, it is noted that the present invention is not limited to the number or location of assemblies depicted in FIGS. 3B-3D as it is anticipated that numerous equivalent or analogous configurations are within the scope of the present invention.

Figure 3E:
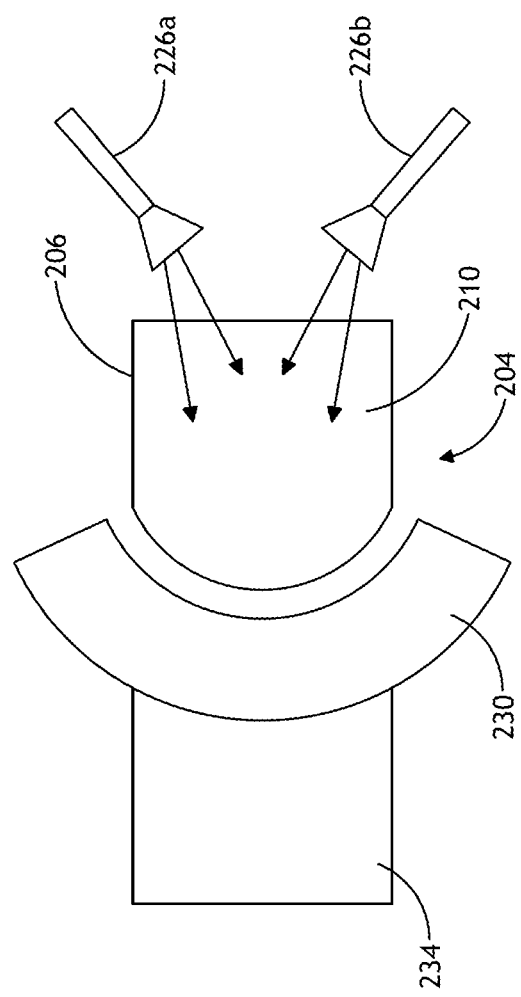
FIG. 3E is a schematic overhead view of a large optical surface cleaned by a single gas delivery unit using multiple delivery nozzles and an exhaust duct in accordance with an alternative embodiment of the present invention.

FIG. 3E depicts one or more delivery nozzles 226a, 226b mounted at a high angle of incidence relative to the optical surface 210 of an optical element 206 of an optical assembly 204, in accordance with one embodiment of the present invention. In one embodiment, the nozzles 226a, 226b direct the flow of cleaning gas onto the optical surface 210 at a high angle of incidence, near perpendicular to optical surface 210. In another embodiment, the collection nozzle 230 may be configured to collect cleaning gas from the partial circumference or perimeter of the optical surface 210 and extract it from the vacuum process chamber via exhaust duct 234.

FIG. 3F depicts one or more delivery nozzles 226a, 226b mounted at a high angle of incidence relative to the optical surface 210 of an optical element 206 of an optical assembly 204, in accordance with an alternative embodiment of the present invention. In one embodiment, a delivery nozzle 226 may direct the flow of cleaning gas onto the optical surface 210 at a high angle of incidence. In a further embodiment, a collection shroud 232 may be configured to collect cleaning gas from around the circumference or perimeter of the optical surface 210.

In some alternative embodiments of the present invention, a bulk flow of process gas is directed through the vacuum process chamber in order to clean optical surfaces and remove contaminants from one or more optical assemblies. In these alternative embodiments, a bleed-flow system may be used to introduce high purity cleaning gas near the edge of the one or more optical surfaces, upstream relative to the bulk flow of process gas. In one embodiment, the bleed flow may be less than ten percent of the bulk flow of process gas. For example, the bleed flow may be one percent of the flow of process gas. In some embodiments, the high purity cleaning gas may include any high purity gas known in the art. For example, the cleaning gas may include an inert gas, molecular hydrogen, atomic hydrogen radicals or ions, or other high purity gases.

FIG. 3G depicts the implementation of bleed flow gas 310 and process gas 308 by system 200, in accordance with one embodiment of the present invention. In one embodiment, the bleed gas flow 310 is introduced near the edge of an optical element 206 (e.g., mirror) perpendicular, or approximately perpendicular, to the bulk flow of process gas 308, creating between the optical surface 210 and the bulk flow of process gas 308 a boundary layer 312. The boundary layer 312 is free or mostly free of water molecules, hydrocarbons, oxygen, and other contaminants. In this regard, the boundary layer 312 protects the optical surface 210 from contaminants carried in the bulk flow of process gas 308 (e.g., contaminants originating from outgassing). For example, the boundary layer 312 may act to protect against contaminants originating from outgassing of walls or surfaces 214 throughout the vacuum chamber and/or optical assembly 204.

In another embodiment, the bulk process gas 308 is configured to flow parallel to the boundary layer 312 with little dispersion or turbulence between layers. Further, the bulk flow of process gas 308 may act as a blanket, pushing the boundary layer 312 over the optical surface 210. It is noted herein that pushing the boundary layer against the optical surface 210 may act to maximize, or at least improve, contact between the cleaning gas 310 and the optical surface 210 for high cleaning efficiency. Any existing turbulence between the boundary layer 312 and the bulk flow of process gas 308, or installation of a trip-strip feature 316 mounted upstream of the optical surface 210, may enhance diffusion or advection of contaminants extracted from the optical surface 210 into the bulk flow of process gas 308, where the contaminants are carried with the gas from the optical assembly 204.

FIG. 3H depicts the introduction of bleed gas flow 310 across an optical surface 210 parallel to the bulk flow of process gas, in accordance with one embodiment of the present invention. It is noted herein that the use of cleaning gas only in the boundary layer 312 immediately adjacent to the optical surface 210 significantly reduces the volumetric flow of bulk process gas 308 required to keep optical surface 210 clean.

Figure 3I:
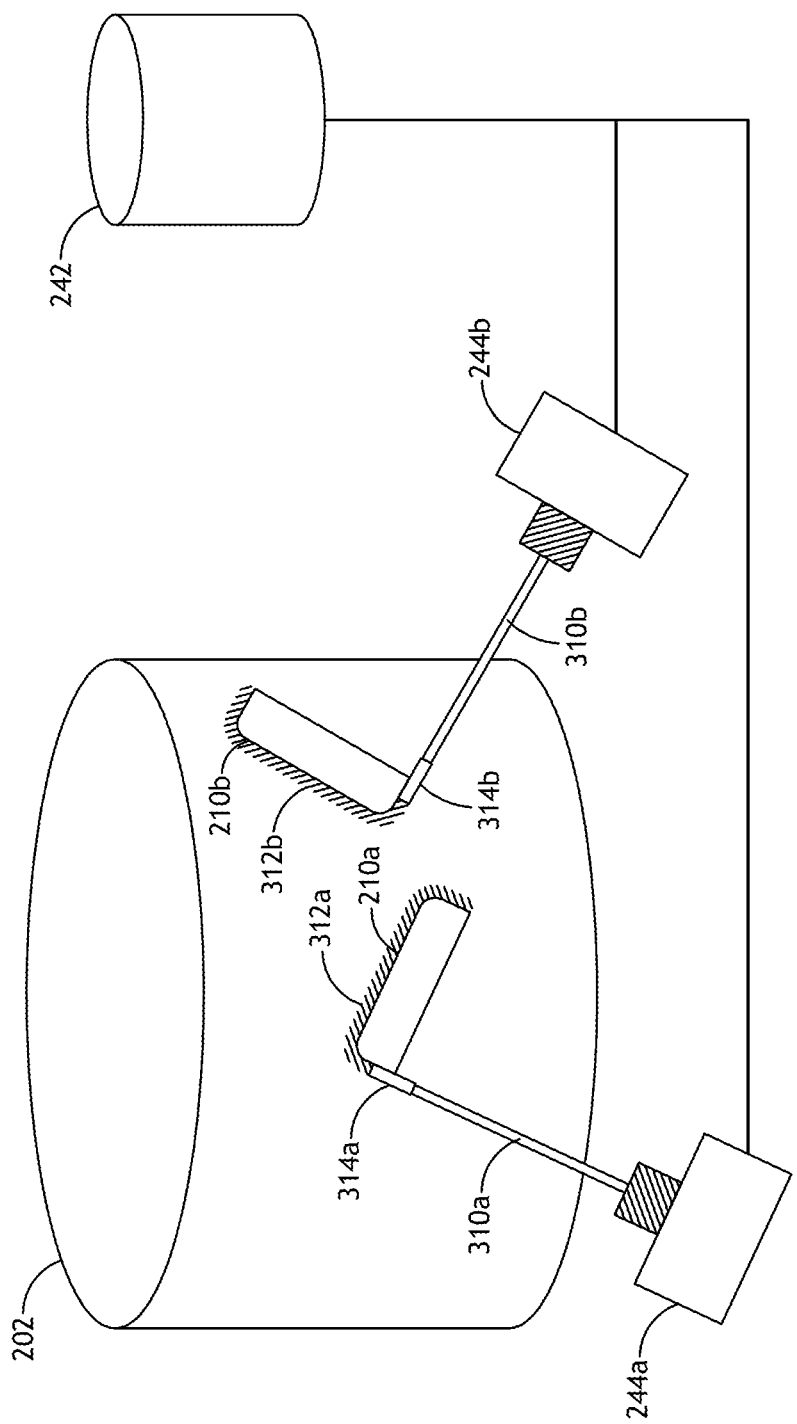
FIG. 3I is a schematic view of a vacuum process chamber wherein multiple optical surfaces are cleaned by a bleed flow system in accordance with an alternative embodiment of the present invention.

FIG. 3I depicts the utilization of a remote supply 242 of molecular hydrogen as a cleaning gas, in accordance with one embodiment of the present invention. In one embodiment, when the EUV light source is activated (i.e., the operational phase) gas delivery lines 310a, 310b create boundary layers 312a, 312b by supplying high purity molecular hydrogen gas to the optical surfaces 210a, 210b via bleed flow nozzles 314a, 314b. In a further embodiment, one or more remotely mounted cleaning heads 244a, 244b are deactivated during operational phases and activated during mirror cleaning phases (when the EUV light source is deactivated), converting the molecular hydrogen gas into atomic hydrogen radicals and ions. In a further embodiment, the cleaning heads 244a, 244b may include a plasma source suitable for atomizing hydrogen. It is noted herein that any mechanism suitable for atomizing hydrogen may be incorporated into the cleaning heads 244a, 244b.

FIG. 3J depicts the implementation of a single remote gas source 242 to clean multiple optical surfaces 210a, 210b disposed within a vacuum process chamber 202. In one embodiment, the single remote source 242 may include a single remote source of molecular hydrogen gas. In another embodiment, the single remote source 242 is connected to a single cleaning head 244 configured to ionize the molecular hydrogen gas when activated during mirror cleaning phases. In a further embodiment, the one or more gas delivery lines 310a, 310b, may then deliver the supply of atomic hydrogen radicals and ions to the one or more optical surfaces 210a, 210b, thereby forming the one or more boundary layers 312a, 312b of hydrogen radicals and ions.

Figure 4:
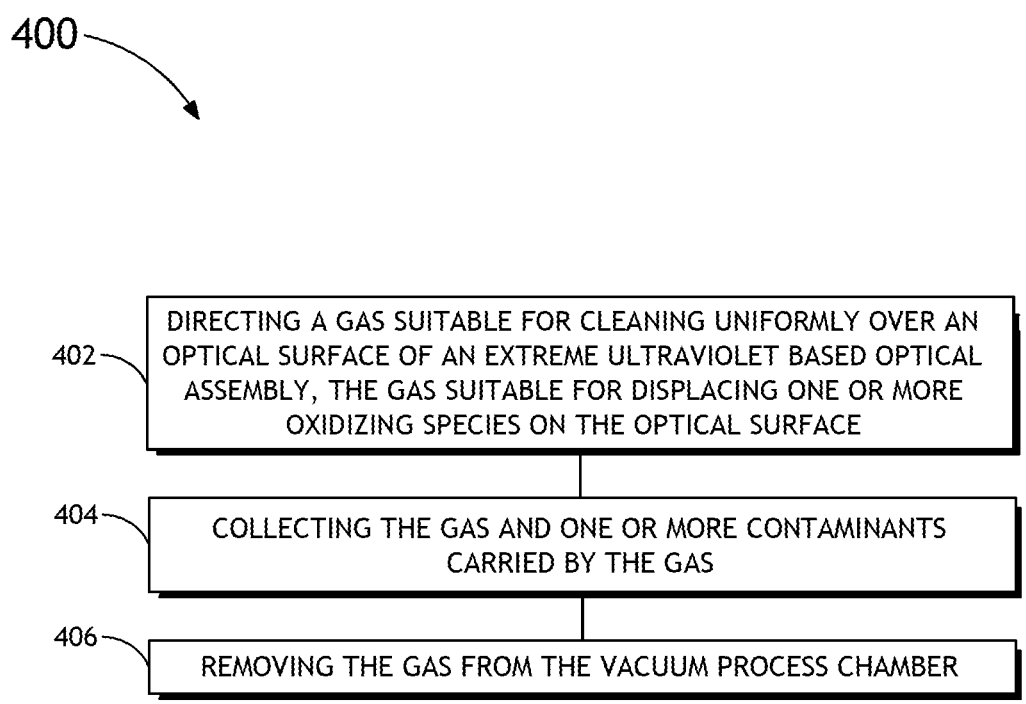
FIG. 4 is a process flow diagram depicting a method of cleaning an optical surface in a vacuum process chamber in accordance with an alternative embodiment of the present invention.

FIG. 4 illustrates a process flow diagram of a method 400 for cleaning optical surfaces in an EUV vacuum process chamber, in accordance with one embodiment of the present invention. It is noted herein that the method 400 may be carried out utilizing any of the embodiments described previously. It is further noted, however, that method 400 is not limited to the components or configurations described previously as multiple components and/or configurations may be suitable for executing method 400.

At step 402, the method 400 directs at least one gas suitable for cleaning uniformly over an optical surface of an EUV optical assembly disposed within a vacuum process chamber. In one embodiment, the EUV optical assembly consists of at least a portion of an EUV-based inspection tool. In one embodiment, the EUV optical assembly consists of at least a portion of an EUV-based metrology tool. In another embodiment, the EUV optical assembly consists of at least a portion of an EUV-based lithography tool. In another embodiment, the at least one gas combines with oxygen on the optical surface to produce loose oxygen and water molecules. In another embodiment, the at least one gas acts to displace hydrocarbon-containing gases in the immediate vicinity of the optical surface. In a further embodiment, the at least one gas occupies sites on the optical surface to which carbon atoms may otherwise be bindable. At step 404, the method 400 collects the gas along with one or more contaminants carried by the flow of gas. At step 406, the method 400 removes the gas from the vacuum process chamber.

Figure 5:
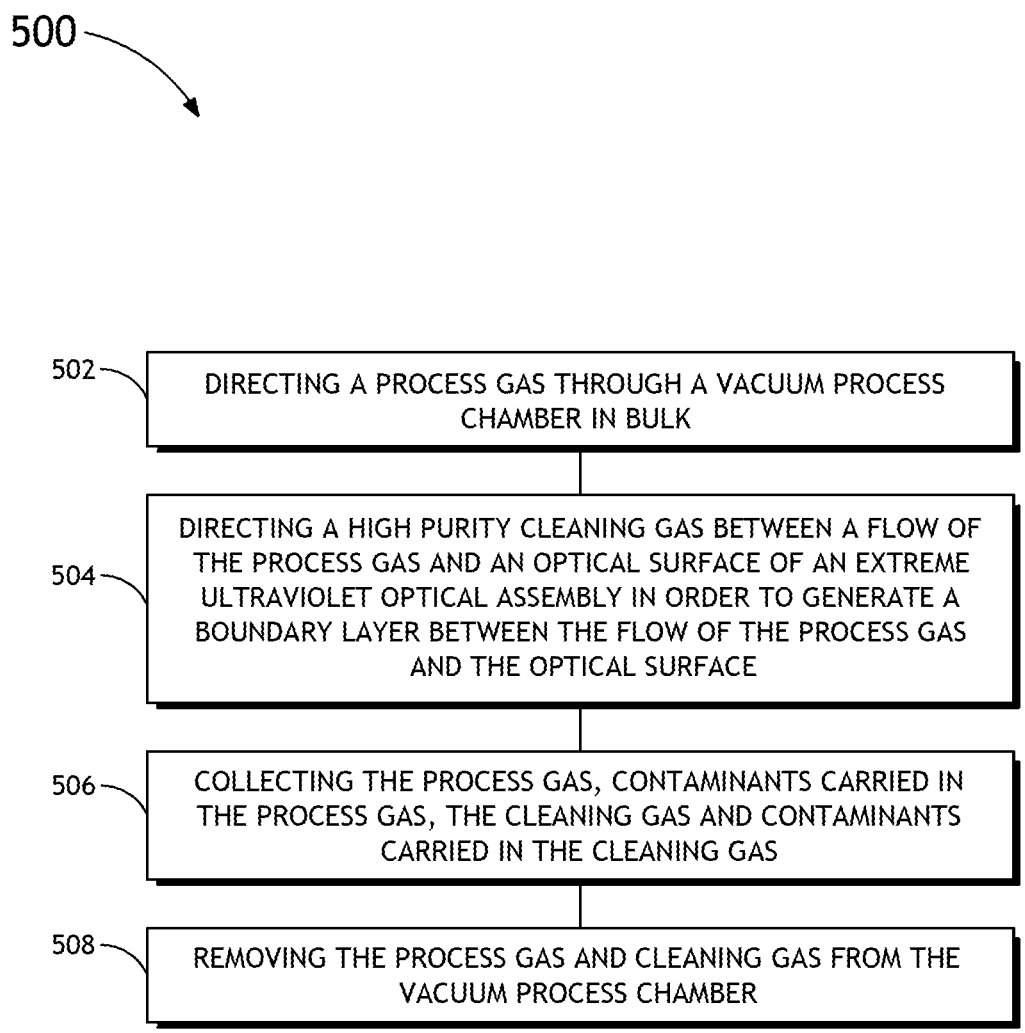
FIG. 5 is a process flow diagram depicting a method of cleaning an optical surface in a vacuum process chamber in accordance with an alternative embodiment of the present invention.

FIG. 5 illustrates a process flow diagram of a method 500 for cleaning optical surfaces in a vacuum process chamber, in accordance with an alternative embodiment of the present invention. It is noted herein that the method 500 may be carried out utilizing any of the embodiments described previously. It is further noted, however, that method 500 is not limited to the components or configurations described previously as multiple components and/or configurations may be suitable for executing method 500.

At step 502, the method 500 directs at least one process gas suitable for cleaning over an optical surface of an EUV optical assembly disposed within a vacuum process chamber. In one embodiment, the EUV optical assembly consists of at least a portion of an EUV-based inspection tool. In one embodiment, the EUV optical assembly consists of at least a portion of an EUV-based metrology tool. In another embodiment, the EUV optical assembly consists of at least a portion of an EUV-based lithography tool. At step 504, the method 500 directs a high purity cleaning gas between the flow of the process gas and the optical surface in the same direction as the flow of the process gas. In one embodiment, the cleaning gas forms a boundary layer between the optical surface and the flow of process gas. In another aspect, the high purity cleaning gas displaces species that may cause oxidation on, or in the immediate vicinity of, the optical surface. In yet another aspect, the high purity cleaning gas combines with oxygen on the optical surface to produce loose oxygen and water molecules. In another aspect, the high purity cleaning gas displaces hydrocarbon-containing gases in the immediate vicinity of the optical surface. In a further aspect, the high purity cleaning gas occupies sites on the optical surface to which carbon atoms may otherwise be bindable. At step 506, the method 500 collects the gas along with one or more contaminants carried by the flow of gas. At step 508, the method 500 removes the gas from the vacuum process chamber.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

What is claimed:

1. An apparatus for providing a local clean microenvironment near optical surfaces of an extreme ultraviolet optical assembly maintained in a vacuum process chamber comprising:
   one or more extreme ultraviolet optical assemblies including at least one optical element with an optical surface, wherein the one or more extreme ultraviolet optical assemblies comprise at least a portion of at least one of an extreme ultraviolet inspection tool, an extreme ultraviolet metrology tool, or an extreme ultraviolet lithography tool;
   a supply of cleaning gas; and
   a gas delivery unit comprising:
      at least one plenum chamber;
      one or more gas delivery lines connecting the supply of cleaning gas to the at least one plenum chamber;
      at least one delivery nozzle configured to control the local microenvironment by directing a flow of cleaning gas from the at least one plenum chamber to one or more portions of the one or more extreme ultraviolet optical assemblies;
      at least one collection nozzle for removing cleaning gas from the one or more extreme ultraviolet optical assemblies and the vacuum process chamber; and
      a guide skirt configured to contain the flow of cleaning gas from the at least one delivery nozzle, wherein the guide skirt includes a first opening through a first surface, wherein the optical surface of the at least one optical element is disposed within the first opening such that a perimeter of the first opening surrounds an outer edge of the at least one optical element and a normal of the optical surface is perpendicular to the first surface of the guide skirt, wherein the guide skirt includes a second opening through a second surface opposite the first surface, wherein the optical surface disposed within the first opening faces the second opening of the guide skirt to allow optical access to the optical surface through the second opening, wherein the guide skirt and the at least one delivery nozzle are arranged to direct the flow of cleaning gas from the at least one delivery nozzle across the optical surface of the at least one optical element and toward the at least one collection nozzle, wherein the at least one delivery nozzle comprises a converging-diverging nozzle including a throat and is configured to cause the flow of gas to converge and then diverge prior to entering the guide skirt.

2. The apparatus of claim 1, wherein the optical surface includes at least one of a mirror, a filter and detector.

3. The apparatus of claim 1, wherein the cleaning gas comprises at least one of molecular hydrogen, atomic hydrogen, molecular helium, or atomic helium.

4. The apparatus of claim 1, wherein the at least one delivery nozzle is configured to control a flow of cleaning gas through the at least one delivery nozzle.

5. The apparatus of claim 4, wherein the at least one delivery nozzle is configured to control a shape of the flow of cleaning gas through the at least one delivery nozzle.

6. The apparatus of claim 4, wherein the at least one delivery nozzle is configured to control a direction of the flow of cleaning gas through the at least one delivery nozzle.

7. The apparatus of claim 1, wherein the at least one delivery nozzle is configured to lower a partial pressure of contaminants by directing the cleaning gas from the at least one plenum chamber to the one or more portions of the one or more extreme ultraviolet optical assemblies.

8. The apparatus of claim 1, wherein the gas delivery unit is configured to clean at least one of hydrocarbons, acids, bases, metal hydrides, water or oxygen from the optical surface of the one or more extreme ultraviolet optical assemblies.

9. The apparatus of claim 1, wherein the one or more gas delivery lines includes at least one of a duct and a pipe.

10. The apparatus of claim 1, wherein the cleaning gas includes an inert gas.

11. The apparatus of claim 1, wherein the cleaning gas includes at least one of molecular hydrogen and helium.

12. The apparatus of claim 1, wherein the cleaning gas includes at least one of atomic hydrogen and atomic helium.

13. The apparatus of claim 1, wherein the one or more gas delivery lines includes at least one of a hydrogen separation membrane, a chemical filter, a desiccant filter, and fused quartz.

14. The apparatus of claim 1, wherein the cleaning gas is supplied by at least one remote atomic hydrogen generator connected to a remote supply of molecular hydrogen.

15. The apparatus of claim 14, wherein the at least one remote atomic hydrogen generator is configured to dissociate remotely supplied molecular hydrogen gas in radiofrequency (RF) discharge.

16. The apparatus of claim 14, wherein the at least one remote atomic hydrogen generator is configured to dissociate remotely supplied molecular hydrogen gas in direct current (DC) or low frequency alternating current (AC) discharge.

17. The apparatus of claim 14, wherein the at least one remote atomic hydrogen generator flows remotely supplied molecular hydrogen gas across a heated tungsten filament.

18. The apparatus of claim 14, wherein the at least one remote atomic hydrogen generator includes a plasma source.

* * * * *